United States Patent
Oonuki et al.

[11] Patent Number: 5,247,181
[45] Date of Patent: Sep. 21, 1993

[54] ION BEAM PROCESSING APPARATUS AND SPECIMEN REPLACING METHOD FOR THE SAME

[75] Inventors: Hisao Oonuki; Shotaro Ooishi; Isao Hashimoto, all of Hitachi, Japan

[73] Assignee: Hitachi, Ltd., Tokyo, Japan

[21] Appl. No.: 796,366

[22] Filed: Nov. 22, 1991

[30] Foreign Application Priority Data

Nov. 22, 1990 [JP] Japan .................... 2-319832

[51] Int. Cl.⁵ ............................ G21K 5/10
[52] U.S. Cl. .................. 250/492.2; 250/440.11; 250/442.11
[58] Field of Search .............. 250/492.2, 440.1, 442.1, 250/400, 441.1, 443.1, 492.21

[56] References Cited
U.S. PATENT DOCUMENTS 3,968,885  7/1976  Hassan et al. ............. 250/492.2
4,272,682  6/1981  Swann ..................... 250/442.11
4,705,951  11/1987  Layman et al. ............ 250/442.11

Primary Examiner—Constantine Hannaher
Assistant Examiner—Kiet T. Nguyen
Attorney, Agent, or Firm—Antonelli, Terry, Stout & Kraus

[57] ABSTRACT

An ion beam processing apparatus which processes specimens held by a specimen holder in a vacuum vessel by irradiating the specimen with an ion beam. The apparatus includes a raising/lowering device for raising and lowering the specimen holder. When replacing the processed specimen by an unprocessed specimen, the specimen holder is raised and lowered by the raising/lowering device to effect specimen replacement. Due to this arrangement, specimen replacement can be performed automatically without opening the vacuum vessel to atmospheric air thereby increasing productivity.

24 Claims, 2 Drawing Sheets

ION BEAM PROCESSING APPARATUS AND SPECIMEN REPLACING METHOD FOR THE SAME

BACKGROUND OF THE INVENTION

1. Field of the Invention

This invention relates to an ion beam processing apparatus which allows the operation of specimen replacement on the specimen holder to be performed automatically, and to a specimen replacing method for such an ion beam processing apparatus.

2. Description of the Related Art

Conventional ion beam processing apparatuses, as disclosed in, for example, Japanese Patent Laid-Open No. 53-23843 and 61-18132, include a specimen turning mechanism for turning a specimen holder in a vacuum vessel around a center axis and a specimen holder tipping mechanism for tipping the specimen holder, thereby enabling a uniform irradiated with an ion beam.

In an ion beam processing apparatus, it is necessary to cool the specimen while the specimen is processed and, for this purpose a cooling method has been proposed in Japanese Patent Laid-Open No. 56-48132, wherein the specimen holder is provided with flow passages, through which cooling water or cooling gas flows, thereby cooling the specimen from behind.

In the prior-art techniques mentioned above, the specimen is secured to the specimen holder by locking the outer periphery of the specimen by screws or the like, so that only manual replacement of specimen is possible.

Further, to adequately cool the specimen by cooling water or cooling gas flowing on the specimen holder, the specimen must be placed in close contact with the surface of the specimen holder. Thus, manual replacement of the specimen is necessary.

A problem with the manual replacement of the specimen resides in the fact that the vacuum vessel must be opened to atmospheric air each time a specimen replacement is performed. Once the vacuum vessel has been opened, it usually takes about 30 to 60 minutes to re-create a vacuum of the same level as before, thereby substantially reducing productivity. Moreover, a manual replacing operation is rather difficult to perform and, is time consuming.

SUMMARY OF THE INVENTION

It is an object of this invention to provide an ion beam processing apparatus and a specimen replacement method wherein the replacement of a specimen is automated thereby making it possible to perform the replacing operation without opening the vacuum vessel to atmospheric air.

To achieve the above object, according to the present invention an ion beam processing apparatus comprises an ion source for generating ions, with a vacuum vessel being provided for extracting ions from the ion source to process specimens. A conveying mechanism feeds and extracts specimens to and from the vacuum vessel to effect specimen replacement, with a specimen holder, provided in the vacuum vessel, holding a specimen while the specimen is processed, and with a raising/lowering means for raising and lowering the specimen holder at the time of specimen replacement.

In accordance with further features of the present invention, may further comprise a specimen turning mechanism for turning the specimen holder around a central axis, with a specimen tipping mechanism tipping the specimen holder.

The specimen holder is equipped with a locking means for locking specimens with the locking means being adapted to lock a specimen on the specimen holder by the biasing force of springs.

The above-mentioned raising/lowering means may include a spiral groove formed on the outer peripheral surface of a slide table supporting the specimen holder and a pin fastened to the ion-beam-apparatus body and engaging the above groove. By turning the slide table, raising/lowering means can be raised and lowered.

The above-mentioned slide table may turned by a stepping motor or manually.

In accordance with the present invention specimen replacement method of the present invention, a specimen holder holding a specimen which has been processed thereon by an ion beam is raised with the processed specimen being transferred to a conveying mechanism. A specimen which has not been processed and which has been conveyed by the conveying mechanism is transferred to the specimen holder, and the specimen holder is lowered to complete a specimen replacement.

In accordance with further features of the specimen replacement method of the present invention, catch rods supporting a periphery of a specimen which has been processed on a specimen stage by an ion beam are raised thereby raising the specimen, with an arm of a conveying mechanism being brought to a position below the specimen thus raised. The catch rods are lowered to transfer the processed specimen to the arm, and the conveying mechanism is driven to bring the arm, which now holds an unprocessed specimen, to a position above the catch rods. The catch rods are raised to raise the unprocessed specimen and causing the arm to retreat, and the catch rods are lowered to place the unprocessed specimen on the specimen stage.

With the above arrangements, specimen replacement can be automatically effected in the vacuum vessel by raising and lowering the sample holder by the raising/lowering means when transferring to the sample holder a specimen which has been conveyed by the conveying mechanism or transferring the processed specimen to the conveying mechanism. Thus, specimen replacement can be performed without opening the vacuum vessel to the atmospheric air.

Further, since the specimen on the specimen holder is locked by the locking means, the specimen is perfectly secured in position while it is processed by an ion beam, thus making it possible to effect a uniform processing.

DETAILED DESCRIPTION OF THE PREFERRED EMBODIMENTS

Figure 2:
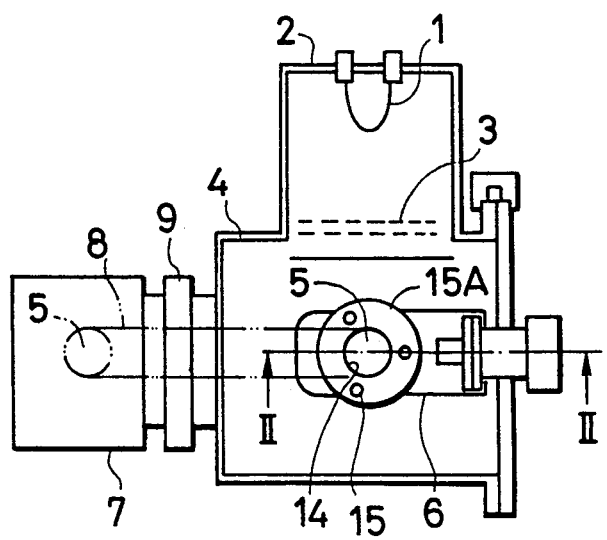
FIG. 2 is a schematic view of a general construction of the ion beam processing apparatus of the present invention.

As shown in FIG. 2, the ion beam processing apparatus of this invention includes an ion source 2 containing a filament 1 for emitting thermoelectrons; electrodes 3 for extracting ions; a vacuum vessel in which a vacuum is maintained; a specimen holder 6 installed in the vacuum vessel 4 and for holding specimens 5; a preparatory chamber 7 for temporarily storing specimens 5; a conveying the mechanism for conveying specimens 5 between the preparatory chamber 7 and the specimen holder 6; and a gate valve 9 for maintaining the vacuum in the vacuum chamber 4 even when the preparatory chamber 7 is opened to the atmospheric air.

Figure 1:
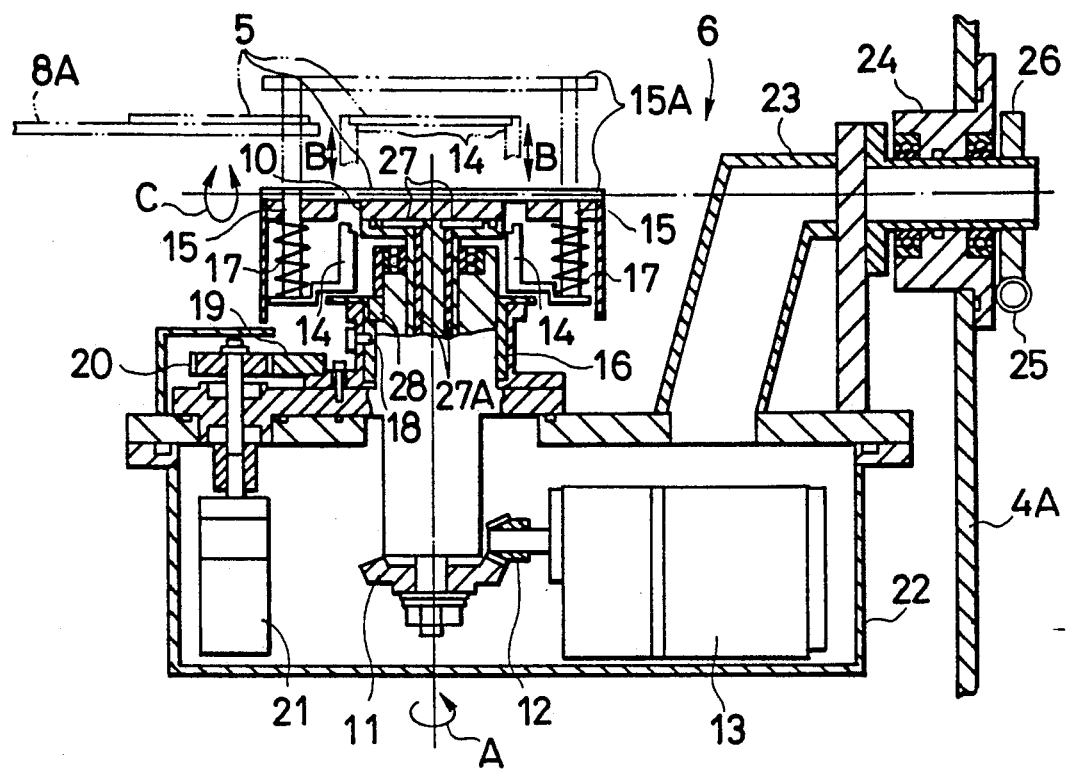
FIG. 1 is a sectional view, taken along the line II—II of FIG. 2, of a specimen holder in accordance with the present invention.

As shown in FIG. 1, the specimen holder 6 is equipped with a circular specimen stage 10 on which specimens 5 are to be placed, with the specimen stage 10 being connected to a motor 13 through gears 11 and 12 and being adapted to turn in the direction indicated by the arrow A when the motor 13 is driven. Arranged around the specimen stage 10 are catch rods 14 capable of being raised and lowered in the direction indicated by the arrows B. When the catch rods 14 are brought to their uppermost position, the top ends of the catch rods 14 support a specimen 5. Arranged outside the catch rods 14 are clamp rods 15, to the top ends of which is attached a ring-shaped clamp 15A. The lower sections of the catch rods 14 and those of the clamp rods 15 are connected with each other.

The respective lower sections of the clamp rods 15 are biased in a downward direction by springs 17. When the catch rods 14 are lowered, leaving the specimen 5 on the specimen stage 10, the periphery of the specimen 5 can be locked by the clamp 15A. When the catch rods 14 are raised, the clamp 15A is raised to a position higher than the top ends of the catch rods 14.

Figure 3:
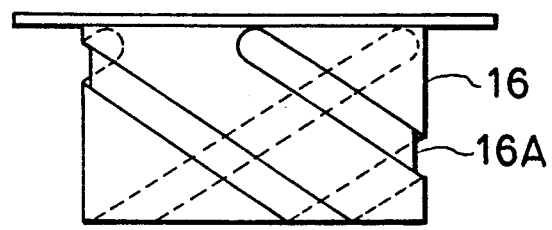
FIG. 3 is a front view of the slide table of the apparatus of the present invention.

The mechanism for raising and lowering the catch rods 14 and the clamp rods 15 includes, as shown in FIG. 3, of a cylindrical slide table 16 having a spiral groove 16A formed on an outer peripheral surface thereof. Pin 18 is fastened to the body of the specimen holder 6 and engages the groove 16A of the slide table 16. The slide table 16 is prevented from rotating by a block 28, with the slide table 16 being adapted to move up and down when rotated, with the pin 18 being engaged with the groove 16A. Further, the slide table 16 is connected to a motor 21 through gears 19 and 20. The gear 19 is of an arc-like configuration and has on its periphery gear teeth which are in mesh with the gear 20, which is an ordinary round gear.

Advantageously, the motor 21 is a stepping motor since a conventional AC or DC motor would not permit easy rotational control, whereas, with a stepping motor, controlled on a pulse-basis, rotational control is easy to perform. The rotation of the motor 21 is controlled by a computer.

The motors 13 and 21 are accommodated in a casing 22, which forms a lower section of the body of the specimen holder 6. The inner space of the casing is open to atmospheric air through a hollow support 23 of the specimen holder 6.

The hollow support 23 is secured to a side wall 4A of the vacuum vessel 4 through the intermediation of a bearing 24. Provided at the outer end of the support 23 is a gear 26 which is in mesh with a worm 25. When a motor (not shown) rotates, the body of the specimen holder 6 can be swing or turned in the direction of the arrow C.

As shown in FIG. 1, grooves 27 are provided for enabling a flow of cooling water or cooling gas flows, with the grooves communicating with flow passages 27A. The conveying mechanism 8 includes an arm 8A by which the specimens 5 are conveyed.

In operation, the clamp rods 15 are raised against the biasing force of the springs 17 to bring the clamp 15A to its raised position. Then, a specimen 5 is conveyed to a position right above the specimen stage 10 by the arm 8A of the conveying mechanism 8. Next, the motor 21 is rotated, and its torque is transmitted to the slide table 16 through the gears 20 and 19 to turn the slide table 16 in one direction. When the slide table 16 turns, the spiral groove 16A, formed on the outer peripheral surface thereof, cooperates with the pin 18 to raise the slide table 16. With the raising of the slide table 16, the catch rods 14 are raised. When the upper ends of the catch rods 14 contact the specimen 5, which is right above the specimen stage 10, the slide table 16 stops its ascent. Then, the arm 8A transfers the specimen 5 to the catch rods 14 and withdraws to the preparatory chamber 7.

Subsequently, the motor 21 turns the slide table 16 in the reverse direction, thereby lowering the slide table 16. As the slide table 16 is lowered, the catch rods 14 are lowered, and the specimen 5, supported at the top ends of the catch rods 14, is placed on the specimen stage 10. Then, the slide table 16 is further lowered, with the catch rods 14 and the clamp rods 15 also being lowered. When the slide table 16 reaches a position completely separated from the lower sections of the catch rods 14, the slide table 16 stops its descent. At this time, the clamp rods 15 are lowered by the biasing force of the springs 17, and the periphery of the specimen 5 on the specimen stage 10 is locked by the clamp 15A. By virtue of this clamp, the specimen 5 is perfectly secured in position and the specimen 5 is prevented from being displaced even when the specimen stage 10 is turned or tipped.

When the processing of the specimen 5 is completed, the slide table 16 is turned in the first direction, in the same manner as described above, whereby the catch rods 14 and the clamp rods 15 are raised and the locking of the specimen 5 by the clamp 15A is canceled. At the same time, the processed specimen 5 on the specimen stage 10 is caught by the top ends of the catch rods 14. Then, the specimen 5 thus caught is raised to a predetermined height at which the arm 8A of the conveying mechanism 8 becomes effective. When the specimen 5 has been raised to this predetermined height, the processed specimen 5 is transferred from the catch rods 14 to the arm 8A. The specimen 5 is then conveyed by the arm 8A to the preparatory chamber 7, where it is replaced by an unprocessed specimen, which is then conveyed to a position above the specimen stage 10. Afterwards, the same operation as described above is repeated.

In this embodiment, the motors 13, 21, etc. are in the atmospheric air, so that maintenance is facilitated.

Further, in accordance with this embodiment, the specimen 5 is press-locked by the clamp 15A, so that the specimen 5 can be maintained in close contact with the surface of the specimen stage 10. Accordingly, the specimen 5 can be adequately cooled by the cooling water or cooling gas flowing in the grooves 27.

Figure 4:
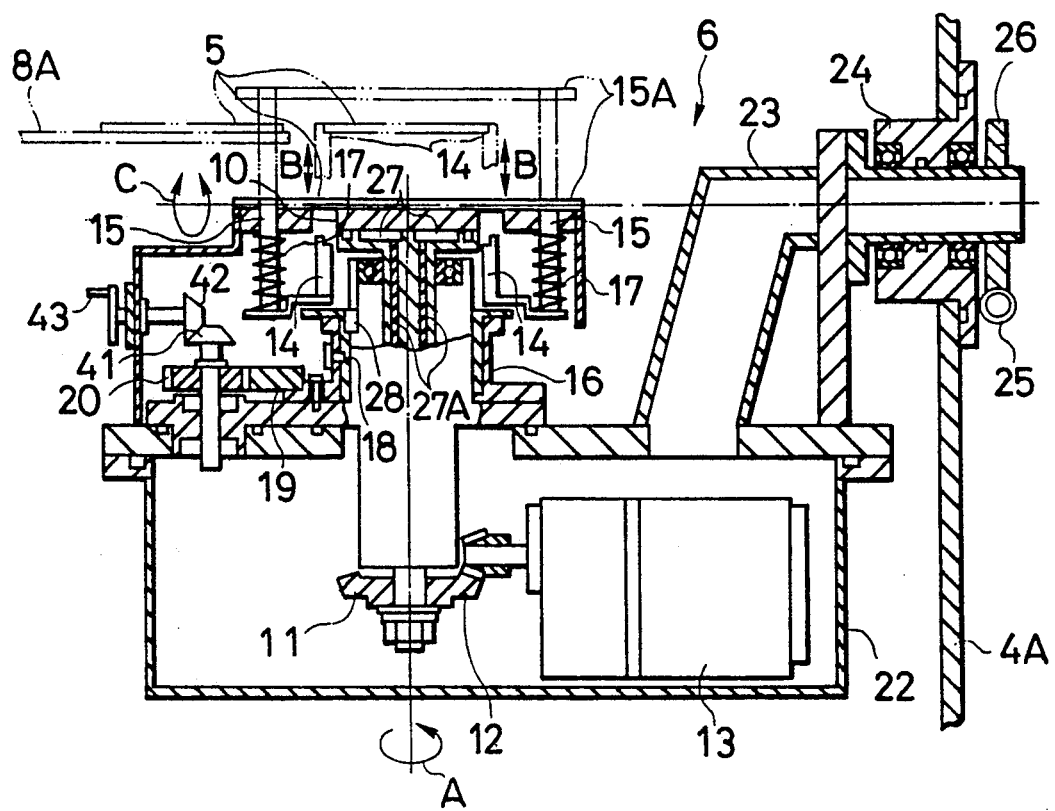
FIG. 4 is a sectional view of a specimen holder in accordance with another embodiment of the present invention.

In the embodiment of FIG. 4, the raising and lowering of the slide table 16 is not effected by a motor but is effected manually. For this purpose, a handle 43 is linked with the gear 20 through gears 41 and 42. By turning the handle 43, the slide table 16 can be raised and lowered.

In the embodiment of FIG. 4, no motor inside the apparatus is necessary for enabling the slide table 16 to be raised and lowered. Accordingly, the driving mechanism for the slide table 16 is simplified, and the apparatus can be produced at lower costs.

As described above, this invention helps to automate the specimen replacing operation, thereby making it possible to perform specimen replacement without opening the vacuum vessel to the atmospheric air, and an increased productivity can be attained.

Further, since it is not necessary to open the vacuum vessel each time specimen replacement is performed, it is possible to omit the operations of cleaning the inside of the vacuum vessel, creating a vacuum, etc.

What is claimed is:

1. An ion beam processing apparatus comprising:
   an ion source for generating ions;
   a vacuum vessel which extracts ions from said ion source to process specimens;
   a conveying mechanism which feeds and extracts specimens to and from said vacuum vessel to effect specimen replacement;
   a specimen holder provided in said vacuum vessel for holding a specimen while the specimen is processed, said specimen holder being supported on a slide table; and
   raising/lowering means for raising and lowering said specimen holder at the time of specimen replacement by rotational movement of said slide table.

2. An ion beam processing apparatus as claimed in claim 1, further comprising a locking means for locking specimens on said specimen holder.

3. An ion beam processing apparatus as claimed in claim 2, wherein said locking means locks specimens on said specimen holder by a biasing force of springs.

4. An ion beam processing apparatus comprising:
   an ion source for generating ions;
   a vacuum vessel which extracts ions from said ion source to process specimens;
   a conveying mechanism which feeds and extracts specimens to and from said vacuum vessel to effect specimen replacement;
   a specimen holder provided in said vacuum vessel for holding a specimen while the specimen is processed; and
   a raising/lowering means for raising and lowering said specimen holder at the time of specimen replacement including a spiral groove formed on an outer peripheral surface of a slide table supporting said specimen holder and a pin fastened to a body of said specimen holder and engaged with said groove, said raising/lowering means being raised and lowered by turning said slide table.

5. An ion beam processing apparatus as claimed in claim 4, wherein a stepping motor is provided for turning said slide table.

6. An ion beam processing apparatus as claimed in claim 4, wherein said slide table is manually turned.

7. An ion beam processing apparatus comprising:
   an ion source for generating ions;
   a vacuum vessel which extracts ions from said ion source to process specimens;
   a conveying mechanism which feeds and extracts specimens to and from said vacuum vessel to effect specimen replacement;
   a specimen holder provided in said vacuum vessel for holding a specimen while the specimen is processed, said specimen holder being supported on a slide table;
   a specimen turning mechanism for turning said specimen holder around a central axis;
   a specimen tipping mechanism for tipping said specimen holder; and
   a raising/lowering means for raising and lowering said specimen holder at the time of specimen replacement by rotational movement of said slide table.

8. An ion beam processing apparatus as claimed in claim 7, further comprising a locking means for locking specimens on said specimen holder.

9. An ion beam processing apparatus as claimed in claim 8, wherein said locking means locks specimens on said specimen holder by a biasing force of springs.

10. An ion beam processing apparatus comprising:
    an ion source for generating ions;
    a vacuum vessel which extracts ions from said ion source to process specimens;
    a conveying mechanism which feeds and extracts specimens to and from aid vacuum vessel to effect specimen replacement;
    a specimen holder provided in said vacuum vessel for holding a specimen while the specimen is processed;
    a specimen turning mechanism for turning said specimen holder around its central axis;
    a specimen tipping mechanism for tipping said specimen holder; and
    a raising/lowering means including a spiral groove formed on an outer peripheral surface of a slide table supporting said specimen holder and a pin fastened to a body of said specimen holder and engaged with said groove, said raising/lowering means being raised and lowered by turning said slide table.

11. An ion beam processing apparatus as claimed in claim 10, wherein a stepping motor is provided for turning said slide table.

12. An ion beam processing apparatus as claimed in claim 10, wherein means are provided for enabling a manual turning of said slide table.

13. A specimen replacement method for an ion beam processing apparatus, the method comprising the steps of:
    moving a specimen, mounted on a specimen stage and processed by an ion beam, to an upper position above the specimen stage;
    transferring the processed specimen to a conveying mechanism at said upper position;
    receiving an unprocessed specimen conveyed to said upper position by said conveying mechanism; and
    moving the unprocessed specimen in a downward direction to place the unprocessed specimen on said specimen stage.

14. A specimen replacement method for an ion beam processing apparatus, the method comprising the steps of:
    raising at least one catch rod supporting a peripheral portion of a specimen, processed on a specimen stage by an ion beam, so as to raise the specimen above the specimen stage;

inserting an arm of a conveying mechanism below the specimen thus raised;

lowering said at least one catch rod to transfer the processed specimen to said arm;

driving said conveying mechanism to move said arm with an unprocessed specimen to a position above said at least one catch rod;

raising said at least one catch rod to raise the unprocessed specimen;

causing said arm to withdraw; and lowering said at least one catch rod to place the unprocessed specimen on said specimen stage.

15. An ion beam processing apparatus comprising:

an ion source for generating ions;

a vacuum container into which ions are introduced from said ion source;

a first transfer means for removing a processed specimen out of said vacuum container;

a specimen stage provided in said vacuum container for accommodating the specimen during processing by applying ions thereto;

a second transfer means movable in a vertical direction by converting a rotary movement into a linear movement to place an unprocessed specimen received from said first transfer means on said specimen stage and deliver the processed specimen received from said specimen stage to said first transfer means; and a specimen locking means adapted to operate with the movement of the second transfer means so as to directly lock the specimen on said specimen stage and release the locking thereof.

16. An ion beam processing apparatus according to claim 15, wherein said specimen locking means locks the specimen by pressing peripheral portions of the specimen from above through a biasing force of a spring.

17. An ion beam processing apparatus according to claim 15, wherein said second transfer means includes a spiral groove formed on an outer peripheral surface thereof, a slide table slidable only in the vertical direction along an outer periphery of said specimen stage, a pin adapted to engage with said groove, and a sleeve rotatable around said slide table, and wherein said second transfer means is movable in the vertical direction by rotating said sleeve.

18. An ion beam processing apparatus according to claim 17, wherein a stepping motor is provided for rotating said sleeve.

19. An ion beam processing apparatus according to claim 17, wherein means are provided for enabling a manual rotation of said sleeve.

20. An ion beam processing apparatus comprising:

an ion source for generating ions;

a vacuum container into which ions are introduced from said ion source;

a first transfer means for removing a processed specimen from said vacuum container;

a specimen stage provided in said vacuum container for accommodating the specimen during processing by applying the ions thereto;

a second transfer means movable in a vertical direction by converting a rotary movement into a linear movement to place an unprocessed specimen received from said first transfer means on said specimen stage and deliver the processed specimen received from said specimen stage to said first transfer means;

a specimen locking means adapted to operate with the movement of the second transfer means so as to directly lock the specimen on said specimen stage and release the locking thereof;

a specimen rotating mechanism for rotating said specimen stage around a central axis thereof; and a specimen tilting mechanism for tilting said specimen stage.

21. An ion beam processing apparatus according to claim 20, wherein said specimen locking mean locks the specimen by pressing peripheral portions of the specimen from above through a biasing force of a spring.

22. An ion beam processing apparatus according to claim 20, wherein said second transfer means includes a spiral groove formed on an outer peripheral surface thereof, a slide table slidable only in the vertical direction along an outer periphery of said specimen stage, a pin adapted to engage said groove, and a sleeve rotatable around said slide table, and wherein said second transfer means is movable along the vertical direction by rotating said sleeve.

23. An ion beam processing apparatus according to claim 22, wherein a stepping motor is provided for rotating said sleeve.

24. An ion beam processing apparatus according to claim 22, wherein means are provided for enabling a manual rotation of said sleeve.

* * * * *